United States Patent [19]
Houlding

[11] Patent Number: 5,344,517
[45] Date of Patent: Sep. 6, 1994

[54] METHOD FOR LIFT-OFF OF EPITAXIAL LAYERS AND APPLICATIONS THEREOF

[75] Inventor: Virginia Houlding, Boulder, Colo.

[73] Assignee: Bandgap Technology Corporation, Broomfield, Colo.

[21] Appl. No.: 52,004

[22] Filed: Apr. 22, 1993

[51] Int. Cl.$^5$ .......................... C25F 3/00; B32B 35/00
[52] U.S. Cl. .................... 156/236; 156/344; 204/129.3; 204/129.75; 204/129.95
[58] Field of Search ............. 204/129.1, 129.3, 129.75, 204/129.95; 156/236, 344

[56] References Cited

U.S. PATENT DOCUMENTS

| | | | |
|---|---|---|---|
| 3,655,540 | 4/1972 | Irvin | 204/129.3 |
| 3,847,697 | 11/1974 | Baker et al. | 156/236 X |
| 4,071,944 | 2/1978 | Chuss et al. | 156/344 X |
| 4,466,852 | 8/1984 | Beltz et al. | 29/426.4 X |
| 4,833,561 | 5/1989 | Sunagawa et al. | 360/114 |
| 4,846,931 | 7/1993 | Gmitter et al. | 156/633 |
| 4,883,561 | 11/1989 | Gmitter et al. | 156/633 |

FOREIGN PATENT DOCUMENTS

H4-10536 1/1992 Japan .

OTHER PUBLICATIONS

Chan et al., "Grafted Semiconductor Optoelectronics", *IEEE J. Quantum Electronics* 27(3): 718–725 (1991).

Kern et al., "Thin Film Processes", *Vossen Ed. (Pub. Academic Press)*, 401–497 (1978).

Konagai et al., "High Efficiency GaAs Thin Film Solar Cells By Peeled Film Technology", *J. Crystal Growth* 45: 277–280 (1978).

Miller, L. F., "Controlled Collapse Reflow Chip Joining", *IBM, J. Res. Develop.*, 239–250 (1969).

Wada et al., "High–Performance, High–Reliability InP-/GaInAs p–i–n Photodiodes And Flip-Chip Integrated Receivers For Lightwave Communications", *J. Lightwave Technology* ((9): 1200–1207 (1991).

Wale et al., "Self-Aligned Flip-Chip Assembly Of Photonic Devices With Electrical And Optical Connections", *IEEE Transactions On Components, Hybrids, and Manufacturing Technology* 13(4): 780–786 (1990).

Yablonovitch et al., "Vander Waals Bonding of GaAs Epitaxial Lift-off Films Onto Arbitrary Substrates" *Appl. Phys. Lett.* 56(24): 2419–2421 (1990).

Yablonovitch et al., "Extreme Selectivity In The Lift-off Epitaxial GaAs Films" *Appl. Phys. Lett.* 51(26): 2222–2224 (1987).

*Primary Examiner*—Mark Osele
*Attorney, Agent, or Firm*—Pennie & Edmonds

[57] ABSTRACT

The present invention provides for improved methods of fabricating layered materials which are epitaxially grown on an electrically conductive single crystal substrate. The improved methods comprise the step of applying an electrochemical potential between the layered material/substrate and a counter electrode to oxidize and dissolve a thin etch layer positioned between the film and substrate, to thereby free the layered material from the substrate.

18 Claims, 1 Drawing Sheet

METHOD FOR LIFT-OFF OF EPITAXIAL LAYERS AND APPLICATIONS THEREOF

FIELD OF THE INVENTION

The present invention provides for improved methods of fabricating layered semiconductor material which is epitaxially grown on a GaAs substrate and subsequently separated from the GaAs substrate. The semiconductor material is separated from the GaAs substrate by dissolving the etch layer located between the semiconductor material and the GaAs substrate. Structural damage to the semiconductor material during the separation step is minimized by the electrochemical dissolution of the etch layer. Additional stabilization may be achieved by attachment of a transfer substrate onto the semiconductor material to stabilize the physical configuration of the semiconductor material during electrochemical separation and subsequent handling.

DESCRIPTION OF THE RELATED ART

The technique of Epitaxial Lift-Off (ELO) has been developed and patented by Yablanovitch, et al. at Bellcore, U.S. Pat. No. 4,896,931, Mar. 29, 1988, "Method for Lifting Off Epitaxial Films", E. Yablanovitch, et al., Bellcore; U.S. Pat. No. 4,883,561, Nov. 28, 1989, "Lift-Off and Subsequent Bonding of Epitaxial Layers", E. Yablanovitch, et al., Bellcore; M. Konagai, et al., *J. Crystal Growth* 45, 277–280 (1978); J. C. C. Fan, *J. Phys.* (Paris) 43, C1–327 (1982); E. Yablanovitch, et al., *Appl. Phys. Lett.* 51, 2222–2224 (1989); and E. Yablanovitch, et al. *Appl. Phys. Lett.* 56, 2419–2421 (1990), and references therein. In brief, a multilayer structure of III-V semiconductor material is grown epitaxially on a GaAs substrate. The structure contains an etch layer of AlAs 50–1000 Angstroms thick located between the ELO layer (the portion to be lifted off) and the GaAs substrate. The substrate with the AlAs etch and ELO layers is then immersed in dilute hydrofluoric acid, which preferentially dissolves the AlAs etch layer. The ELO layer then floats free of the substrate. It can be retrieved and bonded to an arbitrary substrate by Van der Waals bonding, use of an adhesive, or other methods, and an electronic or photonic device can then be fabricated with it. This ELO method relies on the high selectivity of the HF in dissolving AlAs over GaAs or any $Al_xGa_{1-x}As$ composition of x less than 0.4.

A disadvantage of this technique is the formation of trapped gas bubbles during etching. Gas is evolved during the etching of AlAs. The effect of gas bubbles formed in the growing etch microcavity is to warp and crack the thin ELO layer above. Structural damage to the ELO layer affects its electrical and optical characteristics, reducing the probability of fabricating an operative device.

In order to prevent bubble entrapment, U.S. Pat. No. 4,883,561 teaches the use of a layer of stiff black wax that is applied to the top of the ELO structure before etching. The wax exerts a force on the ELO layer during etching which causes it to curl back from the substrate as etching progresses. This purportedly increases diffusion to the etch site and allows gaseous products to escape from the etch cavity before trapped bubbles are formed.

The problem with the black wax ELO method is that the ELO layer is still subject to structural stresses as it is bent during the etch process. This may result in a low yield of successful devices from the ELO layer. Particular problems have been observed in laser and LED devices containing a sensitive multi-quantum well structure.

Additionally, once the thin ELO layer is fabricated and separated from the GaAs substrate it may risk further damage during transfer and attachment to another substrate to form the final device. See U.S. Pat. No. 4,846,931, Mar. 29, 1988, "Method for Lifting Off Epitaxial Films", E. Yablanovitch, et al., Bellcore; U.S. Pat. No. 4,833,561, Nov. 28, 1989, "Lift-Off and Subsequent Bonding of Epitaxial Layers", E. Yablanovitch, et al., Bellcore; M. Konagai, et al., *J. Crystal Growth* 45, 277–280 (1978); J. C. C. Fan, *J. Phys.* (Paris) 43, C1–327 (1982); E. Yablanovitch, et al., *Appl. Phys. Lett.* 51, 2222–2224 (1989); and E. Yablanovitch, et al. *Appl. Phys. Lett.* 56, 2419–2421 (1990), and references therein.

An improved method of separating epitaxial film from a GaAs substrate to minimize damage to the film is therefore desired.

SUMMARY OF THE INVENTION

The present invention is directed to a method of electrochemically dissolving the etch layer which lies between the epitaxial film and the electrically conductive single crystal substrate so as to minimize the formation of gas bubbles, thereby minimizing structural damage to the epitaxial film.

The present invention is also directed to a method of using a transfer substrate to stabilize structurally the epitaxial film while it is being electrochemically separated from the single crystal substrate and subsequently manipulated. Additionally, the transfer substrate may be removed subsequent to the separation or may remain permanently attached to the epitaxial film and a part of the final electronic device.

For example, in order to minimize manipulations after the epitaxial film is electrochemically separated from a single crystal substrate such as GaAs, the epitaxial film may be attached to a "transfer substrate" before the single crystal substrate is separated from the epitaxial film. The transfer substrate may be attached to the epitaxial film by gluing, soldering, melting or bonding with Van der Waals forces. L. F. Miller, *IBM J. Res. Devel.* 1969, 239–250 (1969); K. Mitani and U. M. Goesele, *J. Elect. Materials* 21, 669–676 (1992) and references therein (Silicon); W. I. Chan, A. Yi-Yan, and T. Gmitter, *IEEE J. Quantum Electron.* 27, 717–725 (1991) and references therein (InP); M. J. Wale and C. Edge, *IEEE Trans Components, Hybrids, Mfg. Tech* 13 780–786 (1990) and references therein (GaAs); O. Wada, M. Makiuchi, H. Hamaguchi, T. Kumai, and T. Mikawa, *J. Lightwave Technol.* 9, 1200–1207 (1991) and references therein (GaAs); and Otogi, K. Meguro, T. Unno, and S. Kuma, Japanese Patent No. H4-10536, Issued Jan. 14, 1992.

DETAILED DESCRIPTION OF THE INVENTION

Figure 1:
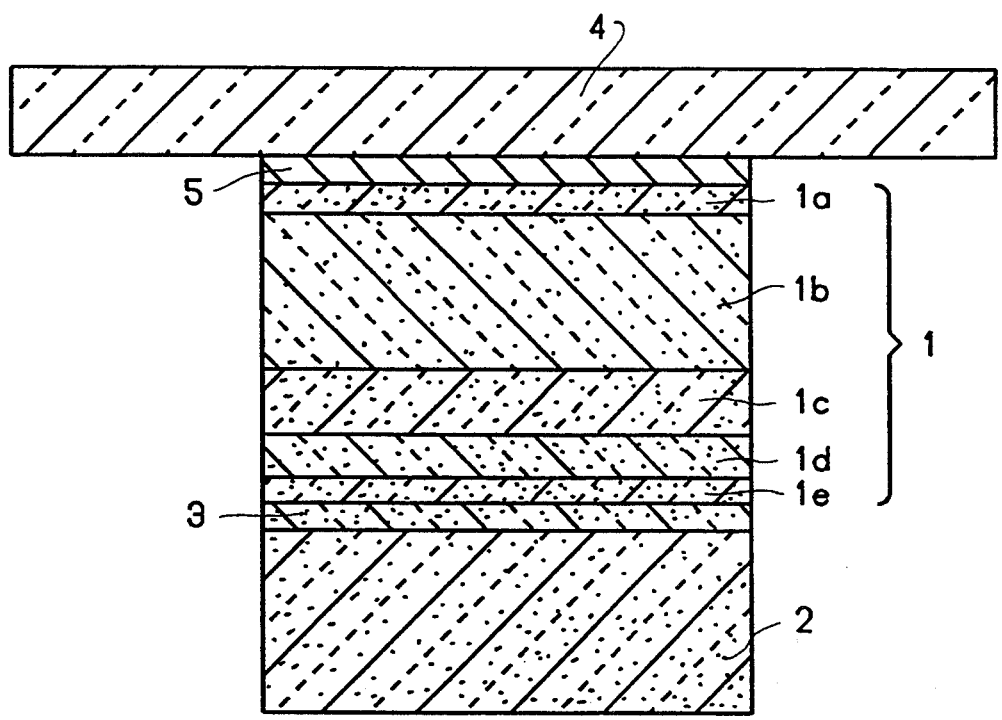
FIG. 1 depicts, in part, an edge-emitting Light Emitting Diode (LED). The LED structure 1 comprises a 500 Å n-type AlGaAs bottom contact layer 1a; a 3.5 μm n-type AlGaAs cladding layer 1b; a 1 μm p-type GaAs active layer 1c; a 5000 Å p-type AlGaAs cladding layer 1d; and a 500 Å p-type AlGaAs top contact layer 1e.

The dissolution of the etch layer is usually accomplished by a redox reaction in which a mineral acid or base attacks or etches the surface of the etch layer. For a general review of chemical etching of semiconductors, see W. Kern and C. A. Deckert, Chapter 5 in "Thin Film Processes", J. L. Vossen and W. Kern, ed(s), New York: Academic Press, 1978. The driving force for etching is the solubilization of the redox products. The etch layer is preferably AlAs and has a thickness of about 50 Å to about 10,000 Å. Most probably, the etching of AlAs by dilute HF is also a redox/solubilization reaction. The chemical composition of the gas evolved has not been reported. Many possible reactions could be envisioned that would account for the bubbles, such as:

$$AlAs + 3HF \rightarrow AlF_3 + AsH_3(g) \quad 1)$$

$$AlAs + 8HF \rightarrow AlF_3 + AsF_3 + 4H_2(g) \quad 2)$$

$$AlAs + 3HF + 4H_2O \rightarrow AlF_3 + H_3AsO_4 + 4H_2(g) \quad 3)$$

Of these, Reaction 3 is the most probable reaction. It involves oxidation of both aluminum and arsenic, with reduction of H+ to hydrogen. It can be generalized to cover the oxidation of arsenic to a nonspecified mixture of different oxyacid species, again accompanied by reduction of HF to hydrogen.

The process of separating epitaxial films (herein used interchangeably with ELO layer) from a GaAs substrate would be significantly improved by a method in which bubbles were not formed at the etch site. If bubble formation is the result of chemical reduction (Reactions 2 or 3 above), it may be separated from the oxidation reaction by using an electrochemical etching technique in which oxidation is carried out at the ELO etch site (anode) and reduction is carried out at a remote electrode (cathode).

The present invention is a method of electrochemically etching an ELO structure. The epitaxial structure (ELO layer and etch layer) are grown on a GaAs substrate that is doped so that the wafer is sufficiently conductive to act as an anode. The etch layer is also doped. It is preferred that at least one part of the ELO layer nearest the etch layer is also doped. N-doping is preferred over p-doping because the layers will be more resistant to electrochemical corrosion. The wafer and film and support are then electrically configured as the anode of an electrochemical cell. The cathode can be a standard Pt or other counterelectrode. The two half-cells can be located in the same electrochemical cell, or else separated into a standard two-cell configuration. A standard reference electrode such as saturated calomel (SCE) is present. Stirring, heating, air exclusion, and other elements of the electrochemical cell design may be employed. The configuration and operation of electrochemical cells is described in detail by Bard and Faulkner. A. J. Bard and L. R. Faulkner, "Electrochemical Methods, Fundamentals and Applications", New York: John Wiley & Sons, Inc., 1980. The only requirement for electrochemical etching is that the electrolyte in the half-cell containing the anode must be a preferential electrochemical etching solution such as a fluoride solution (e.g. dilute HF and a fluoride salt such as NaF, KF or NH4F).

At some optimal applied potential, oxidative etching of the etch layer (e.g. AlAs) will occur at the anode. The potential will be chosen so that reduction will not occur at the anode etch site but only at the cathode. In this way, no gas is evolved at the etch site. The reaction at the cathode will be the reduction of water to hydrogen under most circumstances. The electrochemical etch will be performed until the etch layer is completely dissolved and the ELO layer floats free.

The present invention may be applied to ELO of III-V structures, of II-VI optical structures such as LEDs and lasers based on $(Zn_xCd_{1-x})(S_ySe_{1-y})$ materials, and generally of any structure comprising one or more layers grown epitaxially on a substrate with a sacrificial etch layer in between. The ELO layers may be grown on II-VI or III-V substrates or on any substrate that has a crystalline structure capable of growing the desired epitaxial film. The composition of the etch layer is any epitaxially grown layer that is selectively etchable, while leaving the ELO layer and the substrate undissolved.

As an alternative to having the epitaxial film float free from the GaAs substrate, the epitaxial film may be attached to a rigid transfer substrate prior to the electrochemical etching process. The epitaxial film is thereby held securely by the transfer substrate during the etching and subsequent manipulations of the separated epitaxial film to fabricate the final device. In the following references, the use of a transfer substrate is taught, but not together with electrochemical etching. L. F. Miller, *IBM J. Res. Devel.* 1969, 239–250 (1969); K. Mitani and U. M. Goesele, *J. Elect. Materials* 21, 669–676 (1992) and references therein. (Silicon); W. I. Chan, A. Yi-Yan, and T. Gmitter, *IEEE J. Quantum Electron.* 27, 717–725 (1991) and references therein (InP); M. J. Wale and C. Edge, *IEEE Trans. Components, Hybrids, Mfg. Tech.* 13, 780–786 (1990) and references therein (GaAs); O. Wada, M. Makiuchi, H. Hamaguchi, T. Kumai, and T. Mikawa, *J. Lightwave Technol.* 9, 1200–1207 (1991) and references therein (GaAs); and Otogi, K. Meguro, T. Unno, and S. Kuma, Japanese Patent No. H4-10536, Issued Jan. 14, 1992.

The present invention is further directed to a method of freeing an epitaxial film from a single crystal substrate upon which it was grown comprising attaching a rigid transfer substrate onto the epitaxial film and selectively dissolving in an etch solution a thin etch layer positioned between the film and substrate. The dissolution may be effected electrochemically without dissolving the transfer substrate or substantially weakening the attachment of the transfer substrate to the film. The epitaxial film can then be separated from the transfer substrate by dissolving or otherwise eliminating the attachment means. Because of its structural rigidity, the transfer substrate minimizes damage to the epitaxial film during the above manipulations.

The epitaxial film may be further bonded to a final substrate prior to the separation of the film from the transfer matrix. This final substrate may be selected from the group consisting of glass, silicon wafer, chromium and palladium coated silicon wafer, germanium wafer, III-V material, II-VI material, sapphire, lithium niobate and gadolinium garnet. The etch layer can be AlAs, or any epitaxially-grown layer that is selectively etchable. The etch solution can be an acid solution or an alkaline solution, and most preferably a hydrogen fluoride solution. The single crystal substrate can be GaAs, GaInP, ZnSe, ZnCdSe, and $CuAlSe_2$ or any single crystal substrate that can be used to grow the ELO structure. The epitaxial film can be any layer or combination of layers that can be grown epitaxially on the substrate. The rigid transfer substrate can be polycarbonate or any rigid material with a flat surface that is not dissolved or damaged by the etch solution. The means for attaching the transfer substrate can be an adhesive which will not dissolve in the etch solution but will dissolve in another solution such as acetone. Most preferably the adhesive is one which is not dissolved in aqueous electrolyte solutions but is dissolved in acetone or other nonaqueous solvent.

EXAMPLES

Example 1

Use of Electrochemical Liftoff Method

Refer to FIG. 1. A GaAs/AlGaAs Light Emitting Diode (LED) structure 1 with a p/n junction is grown upside-down on a highly doped GaAs substrate 2, with a 0.05-$\mu$m AlAs etch layer 3 between the substrate 2 and the LED structure 1. The wafer is then cleaved into pieces so that the edges form the ends of an edge-emitting LED structure. A Si wafer 4 is patterned with integrated circuit structures and metal electrodes for the operation of the LED. To form the liftoff structure, an LED wafer piece is metallized with gold/germanium/nickel electrodes 5 and attached by glue or other means onto the top of a Si integrated circuit structure 4, in such a manner that the LED structure 1 faces the Si integrated circuit structure 4. It is aligned if necessary, and pressed so that electrical contact is made between the circuit and the LED structure 1. An electrode is attached to the GaAs substrate 2 and the entire structure is immersed in an electrochemical half-cell containing a fluoride electrolyte. A potential sufficient to evolve hydrogen at the cathode while oxidizing AlAs 3 at the anode is applied to the structure and the AlAs layer 3 is dissolved via anodic reaction. The LED structure 1 is now attached only to the Si integrated circuit on the Si wafer 4 and the LED structure 1 is right-side up. A final metallization on the p-type top contact layer 1e of the LED structure 1 is added to complete the device.

Figure 2:
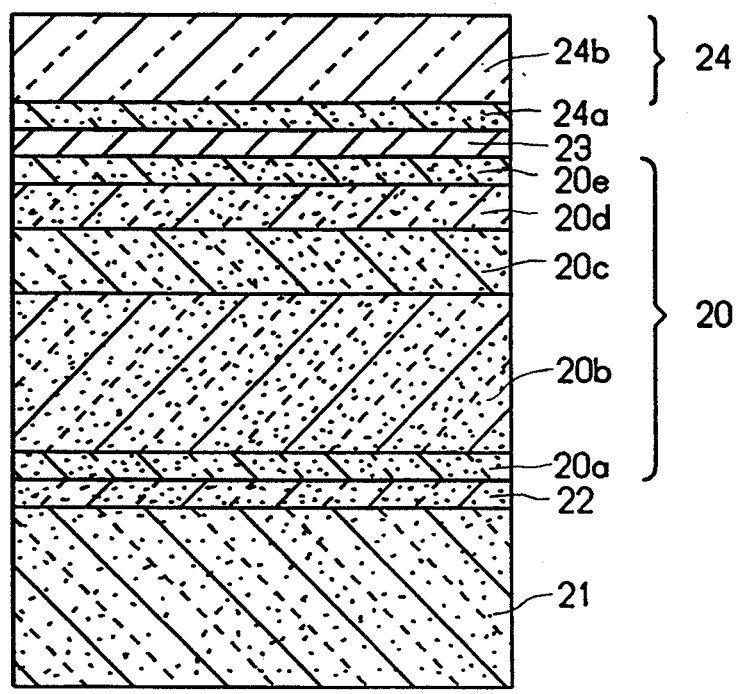
FIG. 2 depicts, in part, a surface-emitting LED. The LED structure 20 comprises a •Å n-type AlGaAs bottom contact layer 20a; a 3.5 μm n-type AlGaAs cladding layer 20b; a 1 μm p-type GaAs active layer 20c; a 5000 Å p-type AlGaAs cladding layer 20d; and a 500 Å p-type AlGaAs top contact layer 20e. Metallization layers are applied to the top and bottom contact layers. The LED functions by emitting through glass 24b.

Refer to FIG. 2. To fabricate a surface-emitting LED, an LED structure 20 is grown right-side up on a highly doped GaAs substrate 21 with a 0.05-$\mu$m AlAs layer 22 in between. Layer 20 comprises, from bottom to top, layers 20a, 20b, 20c, 20d, and 20e. The LED structure 20 on the side opposite the GaAs substrate 21 (e.g., on the p-type top contact layer 20e of the LED structure 20), is then patterned with gold/zinc electrodes 23 and attached onto a conductive transparent substrate 24 (e.g. indium tin oxide 24a on quartz glass 24b with a conducting polymer glue). The AlAs layer 22 is then electrochemically dissolved as described above, thus allowing the LED structure 20 to separate from the GaAs substrate 21. A final metallization layer is placed on the n-type bottom contact layer 20a. The LED functions by emitting through the glass 24b.

Example 2

Use of Temporary Transfer Substrate, I

A liftoff sample $\frac{1}{2}$ cm×$\frac{1}{2}$ cm was cut from a GaAs wafer with an ELO structure grown on it. The top of the ELO layer was fixed to a transfer substrate with "Crystalbond 509" metallurgical adhesive, a proprietary formulation from Aremco Products, Inc., Ossining N.Y. The transfer substrate consisted of 1/16"-thick square of rigid polycarbonate slightly larger than the liftoff sample, chosen because of its resistance to HF. The sample was then placed in 10% HF at 0° C. until the AlAs etch layer was completely dissolved and the ELO/transfer substrate structure was no longer attached to the original GaAs substrate. The ELO/transfer substrate structure was allowed to dry in air. A spot of Norland 61 optical cement smaller in diameter that the ELO layer was applied to a glass slide and the ELO/transfer substrate structure was placed ELO-side-down into the cement. The cement was cured by ultraviolet irradiation through the glass. The transfer substrate was then removed from the ELO layer by dissolution of the Crystalbond wax in acetone.

Example 3

Use of a Temporary Transfer Substrate, II

Conducted as in Example 2 except that the final substrate was a Si wafer coated with 25 nm of evaporated Cr followed by 90 nm of evaporated Pd. The ELO/transfer substrate structure was pressed onto the Pd coating with a static weight of 15 g/cm² and left for several days at room temperature. During this time, a thin intermetallic layer forms between the Pd and the III-V material of the ELO layer which confers good adhesion. The transfer substrate was then removed by dissolution of the Crystalbond wax in acetone as described above.

Example 4

Use of a Temporary Transfer Substrate together with the Electrochemical Liftoff Method Conducted as in Example 2 except that an electrode is attached to the GaAs substrate and electrochemical etching is used to dissolve the AlAs etch layer as described in Example 1.

It is apparent that many modifications and variations of this invention may be made without departing from the spirit and scope thereof. The specific embodiments described are given by way of example only and the invention is limited only by the terms of the appended claims.

A number of references are cited in the present specification, the entire disclosure of each of which is incorporated by reference herein, in its entirety.

I claim:

1. A process for selectively freeing an epitaxial film from an electrically conductive single crystal substrate upon which it was grown comprising:
   a) placing the film and substrate into an etching solution; and
   b) applying an electrochemical potential between the film/substrate and a counter electrode to oxidize and dissolve a thin etch layer positioned between the film and substrate to thereby separate the film and the substrate from each other.

2. The process of claim 1 in which the epitaxial film is multilayered.

3. The process of claim 1 in which the epitaxial film is selected from the group consisting of III-V semiconductor material, II-VI semiconductor material and combinations of both.

4. The process of claim 1 in which the etch layer is AlAs.

5. The process of claim 4 in which the etch layer is between about 50 Å and about 10,000 Å thick.

6. The process of claim 1 wherein the film is attached to a rigid second substrate prior to steps a) and b), and the second substrate remains attached after dissolution of the etch layer.

7. The process of claim 6 wherein the film is attached to a rigid second substrate by attachment means from the group consisting of an adhesive, Van der Waals forces, solder or melt.

8. The process of claim 1 in which the single crystal substrate is n-doped GaAs.

9. The process of claim 1 where in step b) the etch layer is oxidized and dissolved in an electrolyte solution containing dissolved fluoride ions.

10. The process of claim 9 where the electrolyte solution is NaF, KF or $NH_4F$.

11. A process for selectively freeing an epitaxial film from an electrically conductive single crystal substrate upon which it was grown comprising:
   a) attaching a rigid transfer substrate onto the epitaxial film with an adhesive, wherein the transfer substrate and the adhesive are insoluble in an etch solution;
   b) placing the transfer substrate, film and substrate into an etching solution; and
   c) applying an electrochemical potential between the transfer substrate/film/substrate and a counter electrode to dissolve a thin etch layer positioned between the film and substrate to thereby separate the transfer substrate/film and the substrate from each other.

12. The process of claim 11 further comprising a step d) after step c) of placing the transfer substrate and film into another solution that dissolves the adhesive to thereby free the transfer substrate from the film.

13. The process according to claim 12 wherein the transfer substrate and film of step c) is bonded on the film side to a final substrate prior to step d).

14. The process according to claim 13 wherein the final substrate is selected from the group consisting of glass, silicon wafer, chromium and palladium coated silicon wafer, germanium wafer, III-V material, II-VI material, sapphire, lithium niobate and gadolinium garnet.

15. The process according to claim 11 wherein the etch solution comprises dissolved fluoride ions.

16. The process according to claim 15 wherein the transfer substrate is polycarbonate.

17. The process according to claim 12 wherein the solution used in step d) is acetone.

18. The process according to claim 11 wherein the etch layer is AlAs.

* * * * *